United States Patent
Tseng

(10) Patent No.: US 6,239,974 B1
(45) Date of Patent: May 29, 2001

(54) ELECTRICAL ASSEMBLY THAT INCLUDES A HEAT SINK WHICH IS ATTACHED TO A SUBSTRATE BY A CLIP

(75) Inventor: Richard Tseng, Lacey, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/537,953

(22) Filed: Mar. 28, 2000

Related U.S. Application Data

(63) Continuation of application No. 09/110,539, filed on Jul. 6, 1998.

(51) Int. Cl.$^7$ ........................................ H05K 7/20
(52) U.S. Cl. ..................... 361/704; 361/709; 361/715; 361/719; 174/16.3; 165/185; 257/719; 257/727; 248/510
(58) Field of Search ................................ 361/687, 703, 361/704, 715, 717–719; 257/718, 719, 727; 174/16.3; 165/83, 185; 29/457, 458, 625; 248/316.7, 510

(56) References Cited

U.S. PATENT DOCUMENTS

| | | |
|---|---|---|
| 4,441,140 | 4/1984 | Richard . |
| 5,109,318 | 4/1992 | Funari et al. . |
| 5,168,926 | 12/1992 | Watson et al. . |
| 5,617,294 | 4/1997 | Watson et al. . |
| 5,642,263 | 6/1997 | Lauruhn . |
| 5,703,752 | 12/1997 | Woo . |
| 5,726,865 | 3/1998 | Webb et al. . |
| 5,748,446 | 5/1998 | Feightner et al. . |
| 5,779,488 | 7/1998 | Cluff . |
| 5,784,263 | 7/1998 | Nelson . |
| 5,829,601 | 11/1998 | Yurchenco et al. . |
| 5,838,542 | 11/1998 | Nelson et al. . |
| 5,841,633 | * 11/1998 | Huang .................................. 361/695 |
| 5,847,928 | 12/1998 | Hinshaw et al. . |
| 5,854,738 | 12/1998 | Bowler . |
| 5,856,910 | 1/1999 | Yurchenco et al. . |
| 5,883,782 | 3/1999 | Thurston et al. . |
| 5,883,783 | 3/1999 | Turturro . |
| 5,884,692 | * 3/1999 | Lee et al. ............................. 165/80.3 |
| 5,894,408 | 4/1999 | Stark et al. . |
| 5,903,436 | 5/1999 | Brownell et al. . |
| 5,920,120 | 7/1999 | Webb et al. . |
| 5,933,323 | 8/1999 | Bhatia et al. . |
| 5,933,324 | 8/1999 | Barrett . |
| 5,936,838 | 8/1999 | Lii et al. . |
| 5,943,210 | * 8/1999 | Lee et al. ............................... 361/697 |
| 5,959,350 | * 9/1999 | Lee et al. ............................. 257/712 |
| 5,969,946 | * 10/1999 | Lai et al. ............................. 361/704 |
| 5,973,399 | 10/1999 | Stark et al. . |
| 5,978,873 | 11/1999 | Phan . |
| 5,982,622 | * 11/1999 | Chiou ................................... 361/704 |
| 5,982,630 | 11/1999 | Bhatia . |
| 5,991,152 | * 11/1999 | Chiou ................................... 361/704 |
| 6,002,591 | 12/1999 | McCutchan et al. . |
| 6,008,988 | 12/1999 | Palmer . |
| 6,008,990 | * 12/1999 | Liu ....................................... 361/704 |

(List continued on next page.)

Primary Examiner—Leo P. Picard
Assistant Examiner—Boris L. Chervinsky
(74) Attorney, Agent, or Firm—Blakely, Sokoloff, Taylor & Zafman LLP

(57) ABSTRACT

An electronic assembly which includes a heat sink that is pressed into an integrated circuit package by a clip. The integrated circuit package is mounted to a substrate. The clip has an L-shaped ear that is inserted through a clearance hole of the substrate and an attachment hole of the heat sink to attach the heat sink to the substrate. The clip also presses the heat sink into the package. Attaching the heat sink directly to the package reduces the flatness requirements of the sink and the cost of producing the assembly.

15 Claims, 4 Drawing Sheets

U.S. PATENT DOCUMENTS

| | | |
|---|---|---|
| 6,011,696 | 1/2000 | Mahajan et al. . |
| 6,016,006 | 1/2000 | Kolman et al. . |
| 6,025,990 | 2/2000 | Daskalakis et al. . |
| 6,025,994 * | 2/2000 | Chiou ................................... 361/715 |
| 6,043,983 | 3/2000 | Taylor et al. . |
| 6,046,905 | 4/2000 | Nelson et al. . |
| 6,056,601 | 5/2000 | Pollock et al. . |
| 6,068,051 | 5/2000 | Wendt . |
| 6,097,601 * | 8/2000 | Lee ....................................... 361/704 |
| 6,098,938 * | 8/2000 | Tsai ....................................... 361/684 |
| 6,111,747 * | 8/2000 | Jeffries et al. ....................... 361/684 |

* cited by examiner

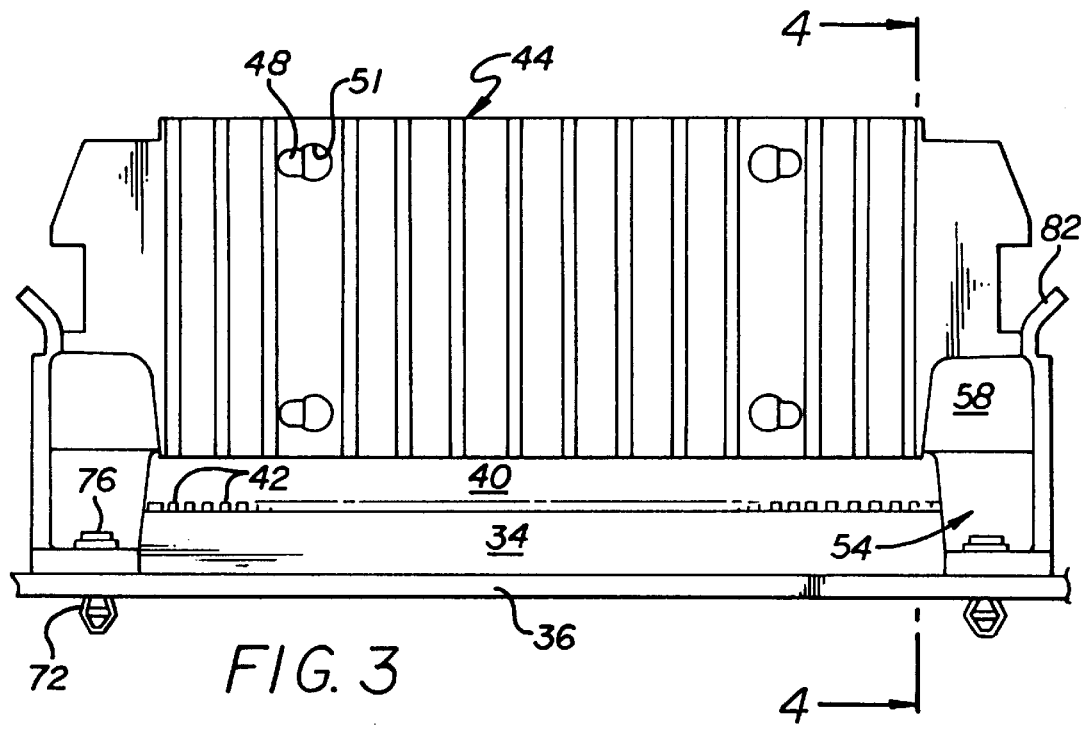
FIG. 3
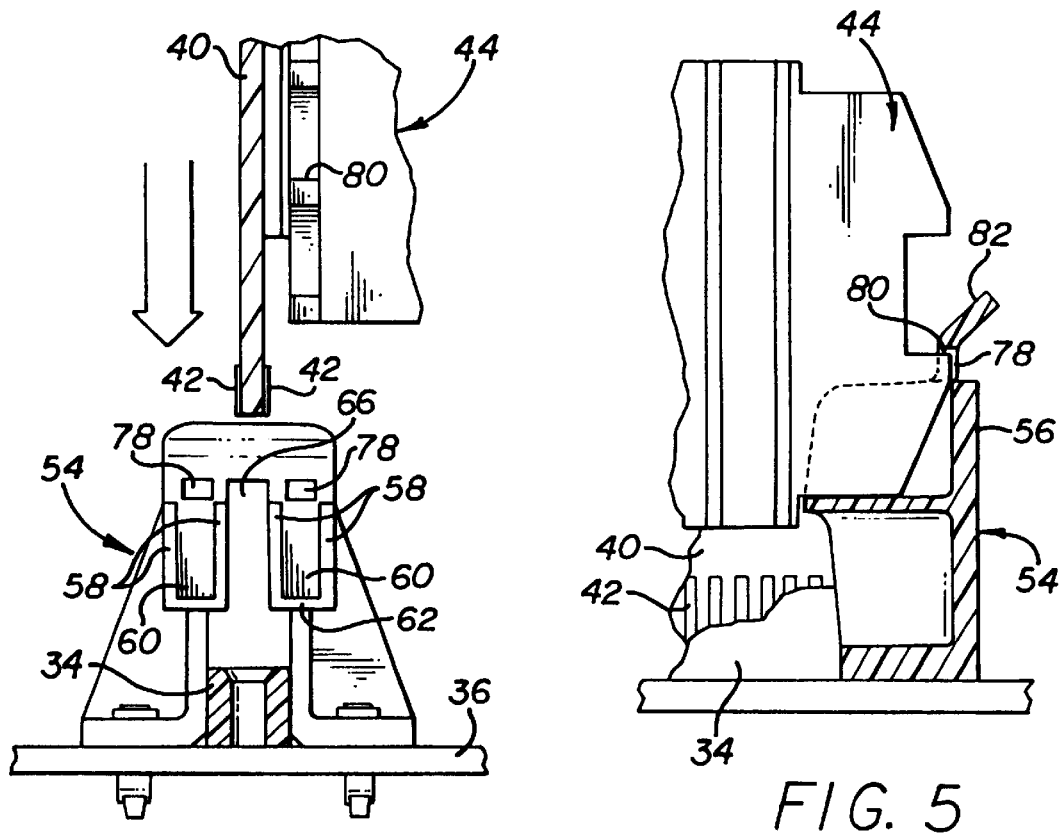
FIG. 4
FIG. 5

ELECTRICAL ASSEMBLY THAT INCLUDES A HEAT SINK WHICH IS ATTACHED TO A SUBSTRATE BY A CLIP

CROSS REFERENCE TO RELATED APPLICATION

This application is a continuation of Application Ser. No. 9/110,539 filed Jul. 6, 1998.

BACKGROUND OF THE INVENTION

1. Field of the Invention

The present invention relates to an electronic cartridge which has a heat sink.

2. Background Information

FIG. 1 shows a product marketed by Intel Corporation, the assignee of this application, which is referred to as a single edge contact cartridge (SECC). The Intel SECC includes a microprocessor which is assembled into a package 1 that is mounted to a substrate 2. The SECC may also have other integrated circuit packages 3 which contain static random access memory (SRAM) integrated circuits.

One edge of the substrate 2 has a plurality of conductive pads 4 which can be inserted into an electrical connector 5. The electrical connector 5 can be mounted to a printed circuit board 6 such as the motherboard of a computer. The pads 4 and connector 5 electrically couple the substrate 2 to the circuit board 6.

The substrate 2 and integrated circuit packages 1 and 3 are enclosed by a cover 7 and a thermal plate 8. The cover 7, plate 8 and substrate 2 provide an electronic cartridge which can be plugged into a computer.

The electrical system shown in FIG. 1 can be subjected to external shock and vibration loads. Such loads may produce intermittent separation between the pads 4 and the connector 5. Intermittent separation between the pads 4 and connector 5 may create electrical "opens." The system is provided with a retention mechanism 9 to secure the substrate 3 to the connector 5 and prevent contact separation under shock and vibration loads.

The retention mechanism 9 includes a pair of posts 10 that are mounted to the circuit board 6. Each post 10 includes an aperture 11 which receives a latch 12 that extends from the cover 7 of the cartridge. When inserted into the aperture 11 each latch 12 prevents the substrate 2 from being pulled out of the connector 5. The substrate 3 can be unplugged from the connector 5 by pressing a pair of latch levers 13 and pulling the cartridge away from the board 6. Pressing the levers 13 moves the latches 12 out of the apertures 11 of the posts 10.

The integrated circuits generate heat which must be removed from the circuits. The thermal plate 8 is thermally coupled to the integrated circuit package 1 of the SECC to provide a thermal path for the heat generated by the microprocessor. A heat sink 14 may be mounted to the thermal plate 8 to further facilitate the removal of heat.

The heat sink 14 typically contains a plurality of fins 15 which extend from a pedestal 16. The pedestal 16 has a mounting surface 17 which mates with a corresponding surface of the thermal plate 8. The mounting surfaces of the thermal plate 8 and the heat sink 14 must be relatively flat to insure that there are no air voids when the components are assembled. Air voids will significantly increase the thermal impedance between the thermal plate 8 and the heat sink 14.

Stringent flatness requirements increase the cost of producing the heat sink and the overall assembly. It would be desirable to provide an electronic assembly similar to the SECC which has a lower cost heat sink.

SUMMARY OF THE INVENTION

One embodiment of the present invention is an electronic assembly which includes a heat sink that is pressed into an integrated circuit package by a clip. The integrated circuit package is mounted to a substrate. The clip has an L-shaped ear that is inserted through a clearance hole of the substrate and an attachment hole of the heat sink to attach the heat sink to the substrate.

BRIEF DESCRIPTION OF THE DRAWINGS

FIG. 3 is a rear view showing a clip that attaches a heat sink to a substrate;

FIG. 4 is an end view showing a substrate being inserted into a retention mechanism;

FIG. 5 is a side sectional view of a substrate and a heat sink inserted into a retention mechanism;

DETAILED DESCRIPTION OF THE INVENTION

One embodiment of the present invention is an electronic assembly which includes a heat sink that is pressed into an integrated circuit package by a clip. The integrated circuit package is mounted to a substrate. The clip has an L-shaped ear that is inserted through a clearance hole of the substrate and an attachment hole of the heat sink to attach the heat sink to the substrate. The clip also presses the heat sink into the package. Attaching the heat sink directly to the package reduces the flatness requirements of the sink and the cost of producing the assembly.

Figure 2:
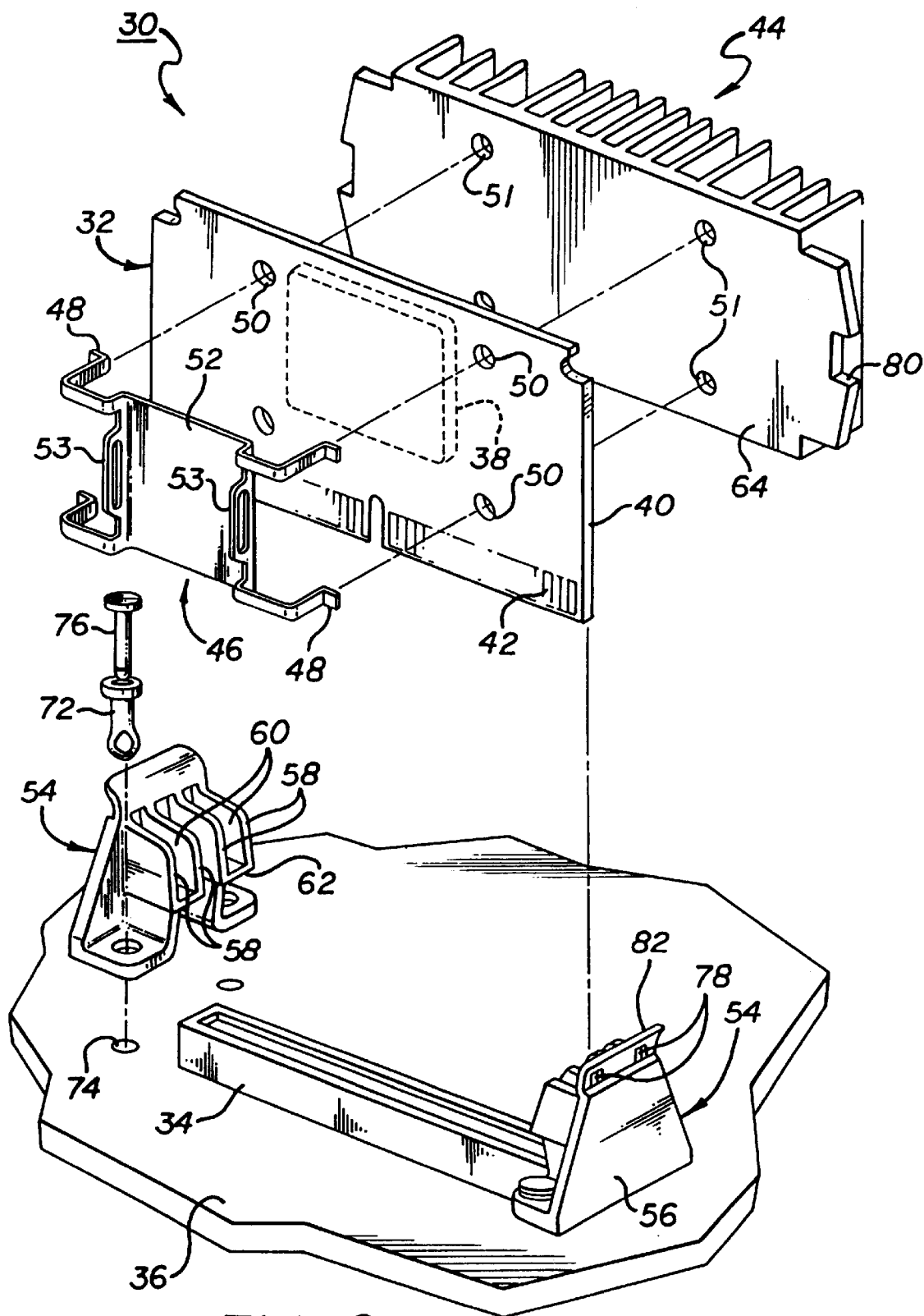
FIG. 2 is a perspective view of an embodiment of an electrical assembly of the present invention.
Figure 6:
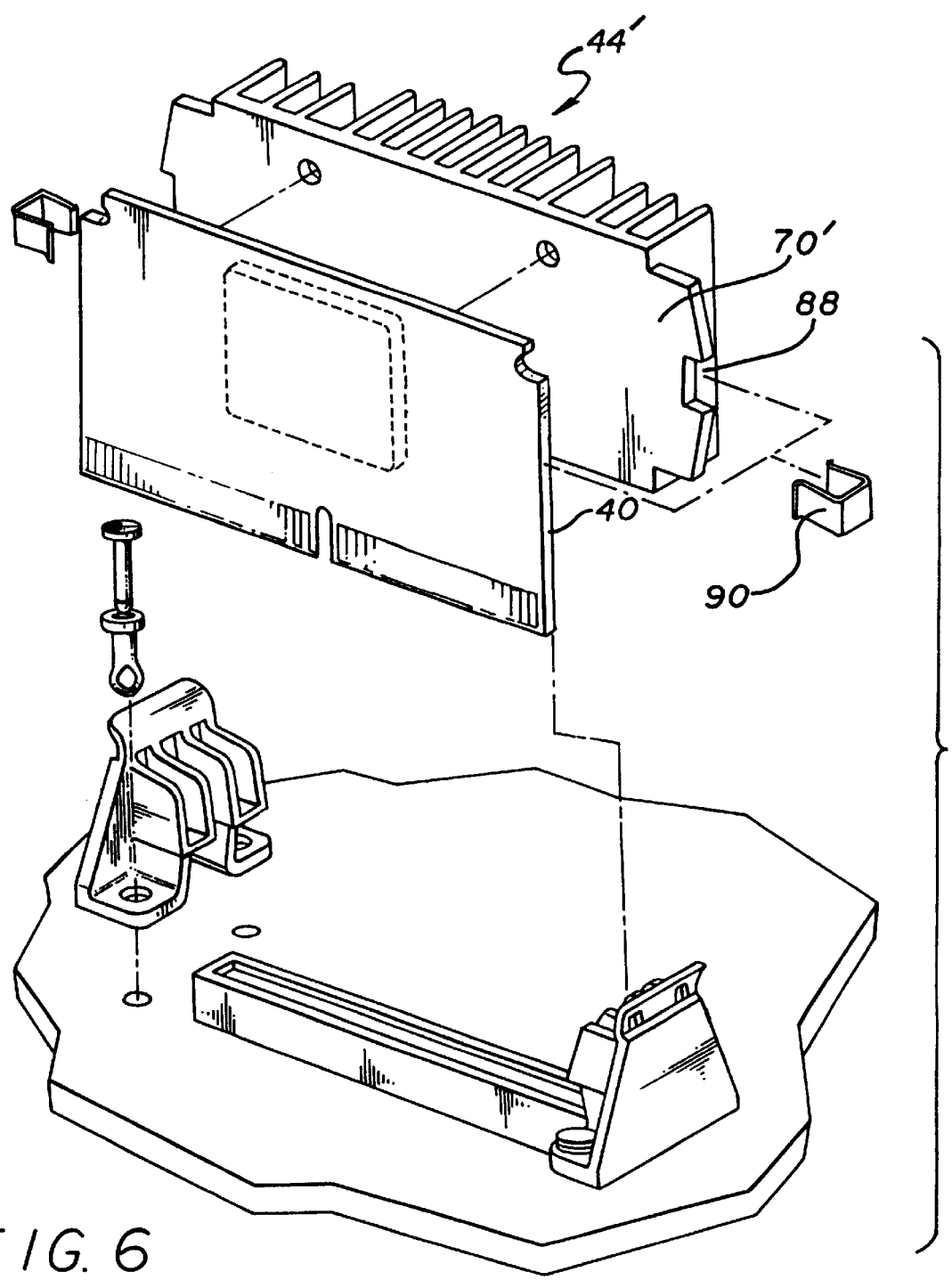
FIG. 6 is a rear perspective view of an alternate embodiment of the electrical assembly.

Referring to the drawings more particularly by reference numbers, FIG. 2 shows an embodiment of an electrical assembly 30 of the present invention. The assembly 30 includes an electronic assembly 32 that can be plugged into an electrical connector 34. The connector 34 may be mounted to a printed circuit board 36. The printed circuit board 36 may be a motherboard of a computer.

The electronic assembly 32 may include an integrated circuit package 38 that is mounted to a substrate 40. The integrated circuit package 38 may contain an integrated circuit (not shown) such as a microprocessor. The substrate 40 may be a printed circuit board. One edge of the substrate 40 may have a plurality of contacts 42 that can be inserted into the electrical connector 34. The substrate 40 may have routing traces, power/ground planes, vias, surface pads, etc. which electrically connect the integrated circuit package 38 to the contacts 42.

The electronic assembly 32 may further have a heat sink 44 that is mounted to the substrate 40. The heat sink 44 may be pressed into the integrated circuit package 38 to provide a thermal path for the heat generated by the integrated circuit. A thermal grease (not shown) may be placed between the heat sink 44 and the package 32. Additionally, the package 32 may have an exposed heat slug (not shown) to further reduce the thermal impedance from the integrated circuit to the heat sink 44. The assembly 32 may include a clip 46 which attaches the heat sink 44 to the substrate 40.

The clip 46 may have a plurality of L-shaped ears 48 that are inserted through clearance holes 50 in the substrate 40 and corresponding attachment holes 51 in the heat sink 44. The clip 46 may have four ears 48 which extend from a center plate portion 52. The L-shaped ears 48 are bent during insertion through the holes 50 and 52. There may be provided a tool (not shown) which bends the ears 48 during the insertion step. The clip 46 may be constructed from a steel material which does not yield during the assembly process. The center plate portion 52 may have a pair of handles 53 that allow an operator to more easily grasp the clip 46 during installation.

As shown in FIG. 3, the L-shaped ears 48 snap back after clearing the attachment holes 52 of the heat sink 44. When assembled, the clip 46 may exert a spring force that pushes the heat sink 44 into the integrated circuit package 38.

Referring to FIG. 2, the assembly 30 may include a pair of retention mechanisms 54 that are mounted to the printed circuit board 36. The retention mechanisms 54 retain and support the electronic assembly 32. Each retention mechanism 54 may have a back wall 56 that extends from the printed circuit board 36. The mechanism 54 may include a plurality of first walls 58 which extend from the backwall 56 and are separated from each other by a pair of heat sink slots 60. The walls 58 are adjoined by a base portion 62. The heat sink 44 may be inserted into either slot 60 and supported by the base portion 62.

As shown in FIG. 4, walls 54 may be separated from each other by a substrate slot 66. The substrate slot 66 may receive the substrate 40.

As shown in FIG. 2, each retention mechanism 54 may have a pair of studs 72 that are pressed into a pair of corresponding holes 74 in the printed circuit board 36. Pins 76 may be pressed into the retention studs 72 to expand the studs 72 and secure the retention mechanism 54 to the circuit board 36. The retention mechanism 54 may have a pair of latch apertures 78.

As shown in FIG. 5, one of the latch apertures 78 may receive a tab 80 of the heat sink 44. When inserted into the aperture 78, the tab 80 prevents the electronic assembly 32 from being pulled out of the connector 34. To remove the assembly 32 an operator can depress a latch arm 82 to move the backwall 56 so that the tab 80 is separated from the retention mechanism 54. For an assembly 30 with two retention mechanism 54 the operator can decouple tabs 80 that are located on both sides of the heat sink 44 from the latch apertures 78. Once the tabs 80 are decoupled from the retention mechanisms 54 the operator can pull the substrate 40 out of the connector 34.

The widths of each slot 60 and 66 are preferably such that the walls 58 apply a spring force onto the sides of substrate 40 and the heat sink 44. The width of the heat sink slot 60 may be the same as the width of the substrate slot 66 so that either slot 60 or 66 can receive the substrate 40 or the heat sink 44. The slots 60 and 66 may also be symmetrically located on the retention mechanism so that a mechanism can be installed on either the right side or left side of the connector 32. This design eliminates the need for a right hand part and a separate left hand part. Separate right hand and left hand parts would increase the complexity of the assembly process and the inventory required for the assembly 30. The walls and studs of the retention mechanisms may all be integrated into a single injection molded part.

Figure 1:
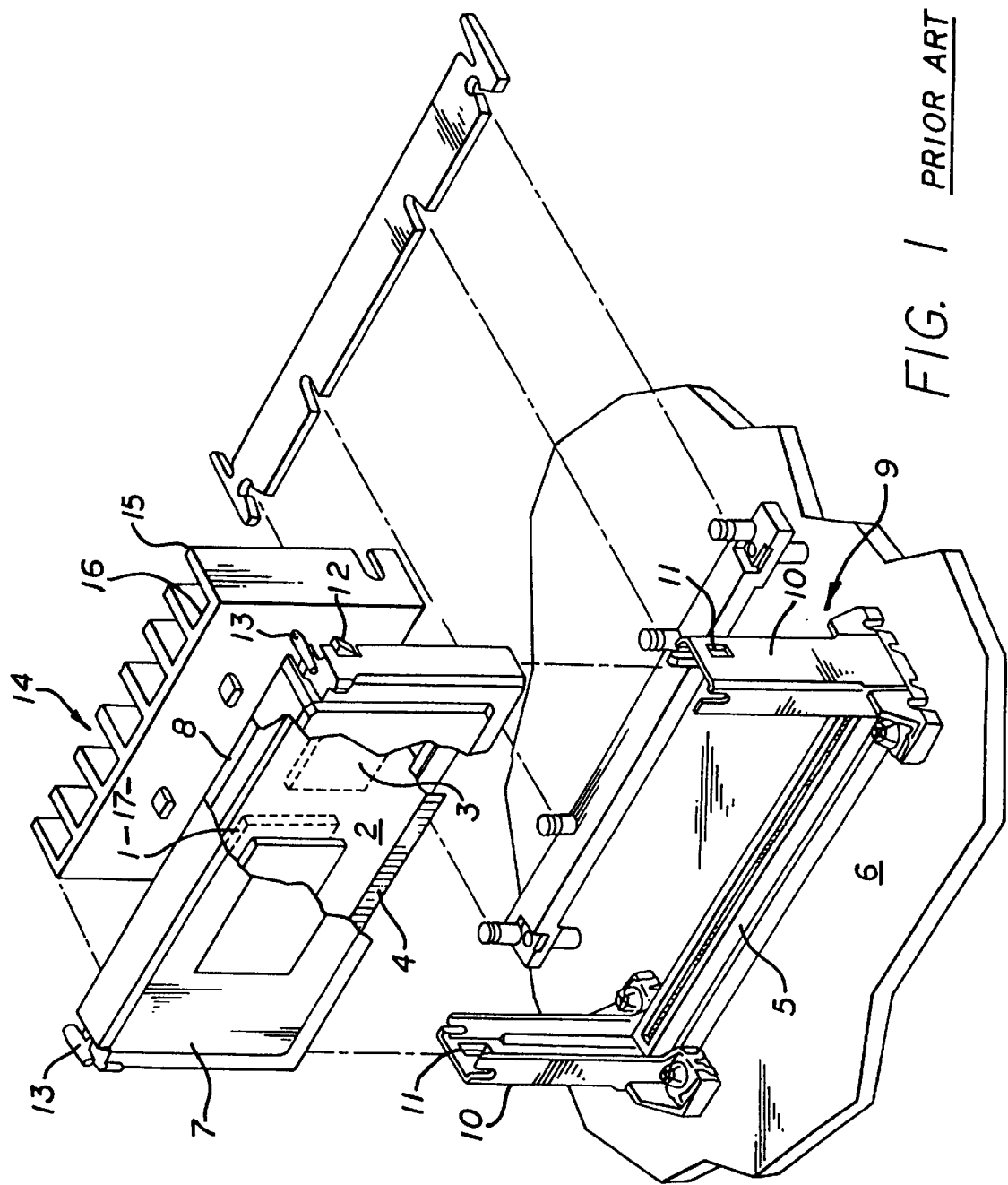
FIG. 1 is a perspective view of an electrical assembly of the prior art.

Referring to FIG. 1, the heat sink 44 may include a plurality of fins 84 and 86 which extend from the pedestal 70. The center group of fins 84 may be longer than the outer fins 86. This allows air to flow across the center fins 84 when the assembly 32 is located in a computer system which has cooling air that flows in a direction normal to the surfaces of the fins.

FIG. 7 shows an alternate embodiment of a heat sink 44' which has a pair of notches 88 located at the ends of a pedestal 70'. The notches 88 may accommodate a pair of clips 90 that wrap around and attach the substrate 40 to the heat sink 44.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A processor daughter card for coupling to a motherboard of a computer, the processor daughter card comprising:

a printed circuit board having a plurality of contacts at an edge for coupling to a socket of the motherboard, a plurality of clearance holes, routing traces and surface pads;

a microprocessor coupled to the surface pads of the printed circuit board to communicate with the plurality of contacts at the edge through the routing traces;

a heat sink having a plurality of attachment holes alligned with the plurality of clearance holes of the printed circuit board, the heat sink to thermally couple to the microprossor on one side of the printed circuit board; and a heat sink fastener having a plurality of L shaped clips inserted through the clearance holes on another side of the printed circuit board and the plurality of attachement holes, the heat sink fastener to hold the heat sink coupled to the printed circuit board and thermally coupled to the microprocessor.

2. The processor daughtercard of claim 1, wherein, the heat sink fastener exerts a spring force that thermally couples the heat sink to the microprocessor.

3. The processor daughtercard of claim 1, wherein, the microprossor is thermally coupled to the heat sink using a thermal grease.

4. The processor daughtercard of claim 1, wherein, there are four attachment holes, four clearance holes and four L shaped clips circumscribing the microprossor to hold the heat sink coupled to the printed circuit board and thermally coupled to the microprocessor.

5. The processor daughtercard of claim 1, wherein, the heat sink has a pedestal that thermally couples to the microprocessor and the heat sink includes fins that extend from the pedestal to thermally couple heat into the surrounding air.

6. The processor daughtercard of claim 5, wherein, the pedestal of the heat sink includes a pair of tabs at opposite ends to couple to a pair of aperatures of a pair of retention mechansisms of the motherboard.

7. The processor daughtercard of claim 1, wherein, the heat sink fastener has a center plate portion from which the plurality of L shaped clips extend, the center plate portion to couple to the another side of the printed circuit board to hold the heat sink coupled to the printed circuit board and thermally coupled to the microprocessor.

8. A computer, comprising:

a motherboard having a daughterboard connector and at least one retention mechanism including a pair of latch aperatures;

a daughterboard including a printed circuit board having a plurality of contacts at an edge for coupling to a socket of the motherboard, a plurality of clearance holes, routing traces and surface pads, a microprocessor coupled to the surface pads of the printed circuit board to communicate with the plurality of contacts at the edge through the routing traces, a heat sink having a plurality of attachment holes alligned with the plurality of clearance holes of the printed circuit board, the heat sink to thermally couple to the microprossor on one side of the printed circuit board, and a heat sink fastener having a plurality of L shaped clips inserted through the clearance holes on another side of the printed circuit board and the plurality of attachement holes, the heat sink fastener to hold the heat sink coupled to the printed circuit board and thermally coupled to the microprocessor; and, wherein the daughterboard is coupled into the duaghterboard connector of the motherboard with a side edge of the printed circuit board and a side edge of a tab of the heat sink coupled into the pair of latch aperatures of the at least one retention mechansim.

9. The computer of claim 8, wherein, the motherboard further includes another retention mechanism with another at least one pair of latch aperatures and wherein the daughterboard further has another side edge of the printed circuit board and another side edge of another tab of the heat sink coupled into the another pair of latch aperatures of the another at least one rentention mechansim.

10. The computer of claim 8, wherein, the heat sink fastener exerts a spring force that thermally couples the heat sink to the microprocessor.

11. The computer of claim 8, wherein, the microprossor is thermally coupled to the heat sink using a thermal grease.

12. The computer of claim 8, wherein, there are four attachment holes, four clearance holes and four L shaped clips circumscribing the microprossor to hold the heat sink coupled to the printed circuit board and thermally coupled to the microprocessor.

13. The computer of claim 8, wherein, the heat sink has a pedestal that thermally couples to the microprocessor and the heat sink includes fins that extend from the pedestal to thermally couple heat into the surrounding air.

14. The computer of claim 13, wherein, the pedestal of the heat sink includes a pair of tabs at opposite ends to couple to a pair of aperatures of a pair of retention mechansims of the motherboard.

15. The computer of claim 8, wherein, the heat sink fastener has a center plate portion from which the plurality of L shaped clips extend, the center plate portion to couple to the another side of the printed circuit board to hold the heat sink coupled to the printed circuit board and thermally coupled to the microprocessor.

* * * * *